United States Patent
Hong et al.

(10) Patent No.: US 11,418,170 B2
(45) Date of Patent: Aug. 16, 2022

(54) BIAS GENERATION CIRCUIT, BUFFER CIRCUIT INCLUDING THE BIAS GENERATION CIRCUIT AND SEMICONDUCTOR SYSTEM INCLUDING THE BUFFER CIRCUIT

(71) Applicant: SK hynix Inc., Icheon-si (KR)

(72) Inventors: Gi Moon Hong, Icheon-si (KR); Dae Han Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/073,066

(22) Filed: Oct. 16, 2020

(65) Prior Publication Data

US 2021/0384894 A1    Dec. 9, 2021

(30) Foreign Application Priority Data

Jun. 5, 2020 (KR) .................. 10-2020-0068164

(51) Int. Cl.
*H03K 3/011* (2006.01)
*H03K 3/012* (2006.01)
*H03H 11/04* (2006.01)

(52) U.S. Cl.
CPC ............. *H03K 3/012* (2013.01); *H03H 11/04* (2013.01); *H03K 3/011* (2013.01)

(58) Field of Classification Search
CPC ......... H03K 3/011; H03K 3/012; G05F 3/222
USPC .................................. 327/306, 378, 512, 513
See application file for complete search history.

(56) References Cited

U.S. PATENT DOCUMENTS

| 9,438,253 | B2 | 9/2016 | Erdogan |
| 9,612,607 | B2 * | 4/2017 | Kumar ..................... G05F 3/30 |
| 10,340,929 | B2 | 7/2019 | Choi et al. |

OTHER PUBLICATIONS

Tae-Young Oh et al., A 7Gb/s/pin GDDR5 SDRAM with 2.5ns Bank-to-Bank Active Time and No Bank-Group Restriction, ISSCC 2010 / Session 24 / DRAM & Flash Memories / 24.1, 2010 IEEE International Solid-State Circuits Conference, pp. 434-436, Feb. 10, 2010, Samsung Electronics, Gyeonggi, Korea.

* cited by examiner

*Primary Examiner* — Hai L Nguyen
(74) *Attorney, Agent, or Firm* — William Park & Associates Ltd.

(57) ABSTRACT

A bias generation circuit may include a bias generator and compensator. The bias generator may be configured to generate a bias voltage based on a reference voltage. The compensator may be configured to detect level changes of a power voltage. The compensator may be configured to control a level of the bias voltage based on detection results.

5 Claims, 3 Drawing Sheets

BIAS GENERATION CIRCUIT, BUFFER CIRCUIT INCLUDING THE BIAS GENERATION CIRCUIT AND SEMICONDUCTOR SYSTEM INCLUDING THE BUFFER CIRCUIT

CROSS-REFERENCES TO RELATED APPLICATION

The present application claims priority under 35 U.S.C. § 119(a) to Korean application number 10-2020-0068164, filed on Jun. 5, 2020, in the Korean Intellectual Property Office, which is incorporated herein by reference in its entirety.

BACKGROUND

1. Technical Field

Various embodiments may generally relate to a semiconductor device, more particularly to a bias generation circuit, a buffer circuit including the bias generation circuit and a semiconductor system including the buffer circuit.

2. Related Art

A semiconductor device may include a plurality of buffer circuits configured to input/output various signals such as data, clock signals, etc.

Operations of the buffer circuit may be affected by the power voltage and the frequency.

For example, when a level of the power voltage is higher than a target level, the delay time of an output signal from the buffer circuit may be decreased. In contrast, when the level of the power voltage is lower than the target level, the delay time of the output signal from the buffer circuit may be increased.

SUMMARY

In example embodiments of the present disclosure, a bias generation circuit may include a bias generator and compensator. The bias generator may be configured to generate a bias voltage based on a reference voltage. The compensator may be configured to detect level changes of a power voltage. The compensator may be configured to control a level of the bias voltage based on detection results.

In example embodiments of the present disclosure, a bias generation circuit may include a comparison circuit, a voltage generation circuit, a voltage change tracker and a bias level controller. The comparison circuit may be configured to compare a feedback voltage with a reference voltage and configured to output comparison results. The voltage generation circuit may be configured to generate a bias voltage through a first current path and a second current path. The feedback voltage may be generated through the first current path based on the output of the comparison circuit. The second current path may be generated by mirroring a current flowing through the first current path. The voltage change tracker may be configured to detect a change of a power voltage. The bias level controller may be configured to control a level of the bias voltage based on an output of the voltage change tracker.

In example embodiments of the present disclosure, a buffer circuit may include a current mode circuit and a bias generation circuit. The current mode circuit may be configured to generate an output signal based on a power voltage and an input signal. The current mode circuit may be configured to compensate for a transition timing change of the output signal based on a level of a bias voltage. The bias generation circuit may be configured to generate the bias voltage based on a reference voltage. The bias generation circuit may be configured to detect level changes of the power voltage. The bias generation circuit may be configured to control the level of the bias voltage based on detection results.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Example embodiments provide a bias generation circuit that may be capable of compensating a change of signal delay time based on a power voltage.

Example embodiments also provide a buffer circuit with the above-mentioned bias generation circuit.

Example embodiments still also provide a semiconductor system with the above-mentioned buffer circuit.

Figure 1:
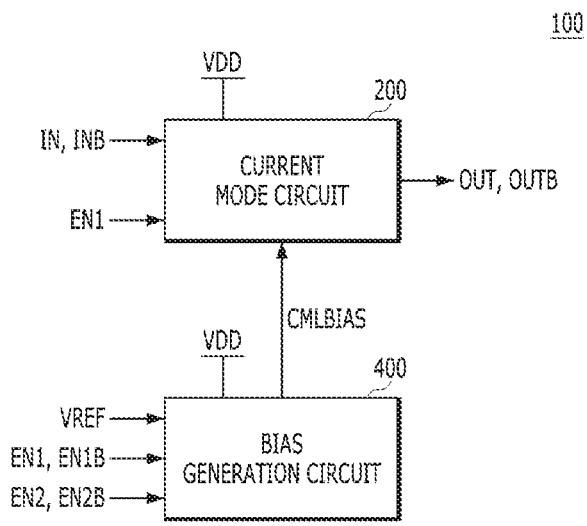
FIG. 1 is a view, illustrating a buffer circuit of a semiconductor device based on example embodiments.

FIG. 1 is a view, illustrating a buffer circuit of a semiconductor device based on example embodiments.

Referring to FIG. 1, a buffer circuit 100 of a semiconductor device based on example embodiments may include a current mode circuit 200 and a bias generation circuit 400.

The current mode circuit 200 may be configured to generate a plurality of output signals OUT and OUTB based on a power voltage VDD, a bias voltage CMLBIAS, a plurality of input signals IN/INB, and a first enable signal EN1.

The power voltage VDD may correspond to a voltage that is applied to a power terminal. The power voltage VDD may be an external voltage or an internal voltage.

Hereinafter, the power voltage VDD may be applied to the power terminal.

The external voltage may include a voltage applied from an external device of the buffer circuit 100 or the semiconductor device with the buffer circuit 100. The internal voltage may include a voltage that is generated in the semiconductor device by using the external voltage.

The input signals IN/INB and the output signals OUT and OUTB may include differential signals.

The current mode circuit 200 may be activated based on the first enable signal EN1.

The bias generation circuit 400 may be configured to generate the bias voltage CMLBIAS based on a reference voltage VREF, the first enable signals EN1 and EN1B, and a second enable signals EN2 and EN2B.

The first enable signals EN1 and EN1B may be activated or inactivated based on various operational conditions, for example, whether the buffer circuit 100 is required to be operated or not. The first enable signals EN1 and EN1B may be provided from the semiconductor device with the buffer circuit 100 or the external device.

The second enable signals EN2 and EN2B may be activated or inactivated based on various operational conditions, for example, a random timing at which the bias voltage CMLBIAS may be controlled, a power-up operation of the semiconductor device, etc. The second enable signals EN2 and EN2B may be provided from the semiconductor device with the buffer circuit 100 or an external device.

The bias generation circuit 400 may be configured to generate the bias voltage CMLBIAS based on the reference voltage VREF, The bias generation circuit 400 may be configured to control a level of the bias voltage CMLBIAS based on the level changes of the power voltage.

When the first enable signals EN1 and EN1B are activated, the bias generation circuit 400 may perform an operation to generate the bias voltage CMLBIAS.

When the second enable signals EN2 and EN2B are activated, the bias generation circuit 400 may perform an operation to control the level of the bias voltage CMLBIAS based on the level changes of the power voltage.

Figure 2:
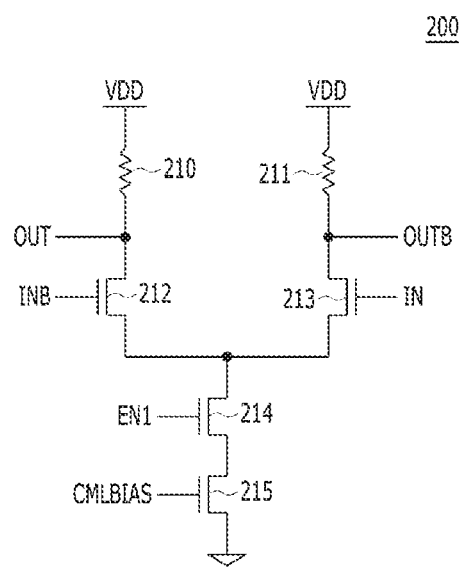
FIG. 2 is a view, illustrating a current mode circuit in FIG. 1.

FIG. 2 is a view, illustrating a current mode circuit in FIG. 1.

Referring to FIG. 2, the current mode circuit 200 may include a first resistor 210, a second resistor 211, a first transistor 212, a second transistor 213, and a current sink circuit 214 and 215.

The first resistor 210 may be connected to a power terminal.

The second resistor 211 may be connected to the power terminal parallely with the first resistor 210.

A source terminal of the first transistor 212 may be connected to the first resistor 210. Any of the input signals IN/INB, for example, the input signal INB, may be inputted into a gate terminal of the first transistor 212.

Any one of the output signals OUT and OUTB, for example, the output signal OUT, may be outputted from a node to which the first resistor 210 and the source terminal of the first transistor 212 may be connected.

A source terminal of the second transistor 213 may be connected to the second resistor 211. Any of the input signals IN/INB, for example, the input signal IN, may be inputted into a gate terminal of the second transistor 213.

Any one of the output signals OUT and OUTB, for example, the output signal OUTB, may be outputted from a node to which the second resistor 211 and the source terminal of the second transistor 213 may be connected.

One end of the current sink circuit 214 and 215 may be commonly connected to the drain terminals of the first and second transistors 212 and 213. The other end of the current sink circuit 214 and 215 may be connected to the ground terminals of the first and second transistors 214 and 215.

The current sink circuit 214 and 215 may include a third transistor 214 and a fourth transistor 215.

A source terminal of the third transistor 214 may be commonly connected to the drain terminals of the first and second transistors 212 and 213. A gate terminal of the third transistor 214 may receive the first enable signal EN1.

A source terminal of the fourth transistor 215 may be connected to a drain terminal of the third transistor 214. A drain terminal of the fourth transistor 215 may be connected to the ground terminal. A gate terminal of the fourth transistor 215 may receive the bias voltage CMLBIAS.

Alternatively, the gate terminal of the third transistor 214 may receive the bias voltage CMLBIAS. The gate terminal of the fourth transistor 215 may receive the first enable signal EN1.

When the first enable signal EN1 is at a high level, the current mode circuit 200 may increase or decrease a sink current based on the level of the bias voltage CMLBIAS to compensate for the transition timing changes of the output signals OUT and OUTB.

For example, when the level of the power voltage VDD is lower than a target level, the transition timings of the output signals OUT and OUTB may be delayed compared to the target timing.

The level of the bias voltage CMLBIAS may be inversely proportional to the level changes of the power voltage VDD. That is, when the level of the power voltage VDD is increased, the level of the bias voltage CMLBIAS may be decreased. In contrast, when the level of the power voltage VDD is decreased, the level of the bias voltage CMLBIAS may be increased.

Thus, when the level of the power voltage VDD is lower than the target level, the level of the bias voltage CMLBIAS may be increased. As a result, the sink current may also be increased by the level of the bias voltage CMLBIAS increasing so that the transition timings of the output signals OUT and OUTB may be quickened.

As mentioned above, the transition timings of the output signals OUT and OUTB, which may be delayed by the level of the power voltage VDD decreasing, may be quickened to compensate for the transition timing changes of the output signal OUT and OUTB.

Figure 3:
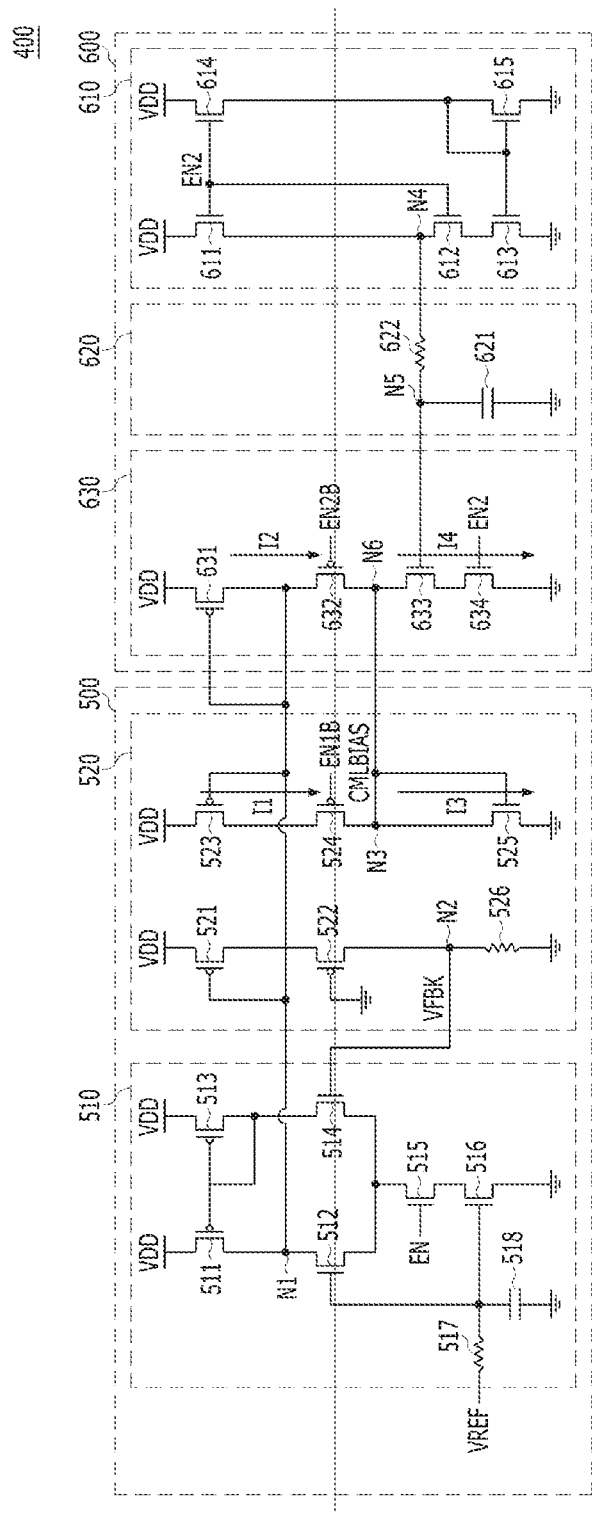
FIG. 3 is a view, illustrating a bias generation circuit in FIG. 1.

FIG. 3 is a view, illustrating a bias generation circuit in FIG. 1.

Referring to FIG. 3, the bias generation circuit 400 may include a bias generator 500 and a compensator 600.

The bias generator 500 may be configured to generate the bias voltage CMLBIAS based on the first enable signals EN1 and EN1B and the reference voltage VREF.

The reference voltage VREF may have a characteristic that is proportional to an absolute temperature. That is, when the temperature rises, the level of the reference voltage VREF may also be increased. In contrast, when the temperature drops, the level of the reference voltage VREF may also be decreased.

The bias generator 500 may include a comparison circuit 510 and a voltage generation circuit 520.

When the first enable signal EN1 is at a predetermined level, for example, a high level, the comparison circuit 510 may compare a feedback voltage VFBK with the reference voltage VREF to output comparison results.

The comparison circuit 510 may include first to sixth transistors 511~516, a resistor 517, and a capacitor 518.

A source terminal of the first transistor 511 may be connected to the power terminal. A drain terminal of the first transistor 511 may be connected to a first node N1.

A drain terminal of the second transistor 512 may be connected to the first node N1.

A source terminal of the third transistor 513 may be connected to the power terminal. A drain terminal of the third transistor 513 may be commonly connected to a gate terminal of the first transistor 511 and a gate terminal of the third transistor 513.

A drain terminal of the fourth transistor 514 may be connected to the drain terminal of the third transistor 513. A gate terminal of the fourth transistor 514 may receive the feedback voltage VFBK.

A drain terminal of the fifth transistor 515 may be commonly connected to a source terminal of the second transistor 512 and a source terminal of the fourth transistor 514. A gate terminal of the fifth transistor 515 may receive the first enable signal EN1.

A drain terminal of the sixth transistor 516 may be connected to a source terminal of the fifth transistor 515. A source terminal of the sixth transistor 516 may be connected to the ground terminal.

The reference voltage VREF may be applied to one end of the resistor 517. The other end of the resistor 517 may be commonly connected to a gate terminal of the second transistor 512 and a gate terminal of the sixth transistor 516.

One end of the capacitor 518 may be commonly connected to the other end of the resistor 517, the gate terminal of the second transistor 512, and the gate terminal of the sixth transistor 516. The other end of the capacitor 518 may be connected to the ground terminal.

Alternatively, the capacitor 518 may be excluded from the comparison circuit 510.

When the capacitor 518 is excluded from the comparison circuit 510, the reference voltage VREF may be directly applied to the gate terminal of the second transistor 512 and the gate terminal of the sixth transistor 516.

The comparison circuit 510 may compare the feedback voltage VFBK with the reference voltage VREF to output the comparison results through the first node N1.

Because the reference voltage VREF may have the temperature proportion characteristic, the voltage that is outputted from the first node N1 may have a level having a compensated temperature level.

When the first enable signal EN1B is a predetermined level, for example, a low level, the voltage generation circuit 520 may generate the bias voltage CMLBIAS based on the output from the comparison circuit 510, i.e., the voltage level of the first node N1.

The voltage generation circuit 520 may include first to fifth transistors 521~525 and a resistor 526.

A source terminal of the first transistor 521 may be connected to the power terminal. A gate terminal of the first transistor 521 may receive the voltage of the first node N1.

A source terminal of the second transistor 522 may be connected to a drain terminal of the first transistor 521. A gate terminal of the second transistor 522 may be connected to the ground terminal. A drain terminal of the second transistor 522 may be connected to a second node N2.

A source terminal of the third transistor 523 may be connected to the power terminal. A gate terminal of the third transistor 523 may receive the voltage of the first node N1.

A source terminal of the fourth transistor 524 may be connected to a drain terminal of the third transistor 523. A gate terminal of the fourth transistor 524 may receive the first enable signal EN1B. A drain terminal of the fourth transistor 524 may be connected to a third node N3.

A drain terminal and a gate terminal of the fifth transistor 525 may be commonly connected to the third node N3. A source terminal of the fifth transistor 525 may be connected to the ground terminal.

One end of the resistor 526 may be connected to the second node N2. The other end of the resistor 526 may be connected to the ground terminal.

A voltage that is applied to the second node N2 may be provided to the comparison circuit 510 as the feedback voltage VFBK.

A voltage that is applied to the third node N3 may be outputted as the bias voltage CMLBIAS.

The voltage generation circuit 420 may include a current mirror. The current mirror may include first current paths 521, 522, and 526 and second current paths 523, 524, and 525. The second paths 523, 524, and 525 may be formed by mirroring the first current path 521, 522, and 526.

The current amount of the first current paths 521, 522, and 526 may be controlled based on the voltage of the first node N1. The bias voltage CMLBIAS may be generated by the second current paths 523, 524, and 525 that are configured to mirror the current amount of the first current paths 521, 522, and 526.

The first current paths 521, 522, and 526 may provide the comparison circuit 510 with the voltage of the second node N2 that corresponds to the bias voltage CMLBIAS as the feedback voltage VFBK.

The compensator 600 may be configured to detect the level changes of the power voltage. The compensator 600 may be configured to control the level of the bias voltage CMLBIAS based on detection results.

The compensator 600 may be configured to detect low-frequency changes that are formed by removing high-frequency noises from the level of the power voltage. The compensator 600 may be configured to control the level of the bias voltage CMLBIAS based on detection results.

The compensator 600 may include a voltage change tracker 610, a low pass filter 620, and a bias level controller 630.

The voltage change tracker 610 may be configured to detect the change of the power voltage VDD.

The voltage change tracker 610 may include first to fifth transistors 611~615.

A source terminal of the first transistor 611 may be connected to the power terminal. A gate terminal of the first transistor 611 may receive the second enable signal EN2. A drain terminal of the first transistor 611 may be connected to a fourth node N4.

A drain terminal of the second transistor 612 may be connected to the fourth node N4. A gate terminal of the second transistor 612 may receive the second enable signal EN2.

A drain terminal of the third transistor 613 may be connected to a source terminal of the second transistor 612. A source terminal of the third transistor 613 may be connected to the ground terminal.

A source terminal of the fourth transistor 614 may be connected to the power terminal. A gate terminal of the fourth transistor 614 may receive the second enable signal EN2.

A gate terminal of the fifth transistor 615 may be connected to a gate terminal of the fourth transistor 614. A drain terminal of the fifth transistor 615 may be connected to the gate terminal of the fifth transistor 615. A source terminal of the fifth transistor 615 may be connected to the ground terminal.

When the second enable signal EN2 is at a predetermined level, for example, a high level, the voltage change tracker 610 may change the voltage level of the fourth node N4 based on the level changes of the power voltage VDD to detect the level changes of the power voltage VDD.

The low pass filter 620 may be configured to remove high-frequency components from the detection results of the power voltage level through the voltage change tracker 610. Thus, only low-frequency components may pass through the low pass filter 620.

The low pass filter 620 may include a capacitor 621 and a resistor 622.

The capacitor 621 may be connected between a fifth node N5 and the ground terminal.

The resistor 622 may be connected between the fourth node N4 and the fifth node N5.

The bias level controller 630 may be configured to control the level of the bias voltage CMLBIAS based on the outputs of the low pass filter 620 and the second enable signals EN2 and TN_ENB.

The bias level controller 630 may include first to fourth transistors 631~634.

The current path with the first to fourth transistors 631~634 may be referred to as a third current path.

A source terminal of the first transistor 631 may be connected to the power terminal. A gate terminal of the first transistor 631 may receive the voltage of the first node N1. A drain terminal of the first transistor 631 may be connected to the gate terminal of the first transistor 631.

A source terminal of the second transistor 632 may be connected to the drain terminal of the first transistor 631. A gate terminal of the second transistor 632 may receive the second enable signal EN2B. A drain terminal of the second transistor 632 may be connected to a sixth node N6.

A drain terminal of the third transistor 633 may be connected to the sixth node N6. A gate terminal of the third transistor 633 may be connected to the fifth node N5.

A drain terminal of the fourth transistor 634 may be connected to a source terminal of the third transistor 633. A gate terminal of the fourth transistor 634 may receive the second enable signal EN2. A source terminal of the fourth transistor 634 may be connected to the ground terminal.

Hereinafter, the operations of the bias generation circuit 400 may be illustrated in detail.

When the first enable signals EN1 and EN1B are activated, for example, EN1=H and EN1B=L, the bias generator 500 may generate the bias voltage CMLBIAS with a level in which the temperature change may be compensated based on the reference voltage VREF.

When the second enable signals EN2 and EN2B are activated, for example, EN2=H and EN2B=L, the compensator 600 may detect the change of the power voltage VDD to compensate for the level of the bias voltage CMLBIAS that corresponds to the detection results.

For example, when the level of the power voltage VDD is increased, the voltage level of the fourth node N4 may be proportionally increased to a resistor ratio between the first transistor 611 and the second and third transistors 612 and 613 in the voltage change tracker 610.

The high-frequency component in the voltage level change of the fourth node N4 may be removed by the low pass filter 620. Only the low-frequency component may be applied to the bias level controller 630 through the fifth node N5.

The current flowing through the second current paths 523, 524, and 525 may be formed by mirroring the current flowing through the first current paths 521, 522, and 526.

A first current I1 that flows through the second current paths 523, 524, and 525 and a second current I2 that flows through the third current paths 631, 632, and 634 may have the same current source as the first node N1. Thus, the first current I1 and the second current I2 may be constant and the same regardless of the change of the power voltage VDD.

The relationship between the first to fourth currents (I1+I2=I3+I4) may be established by the conservation law of the electrical charge.

When a current amount (I1 and I2) is constant, the fourth current I4 may be increased by increasing the voltage level of the fourth node N4 so that the third current I3 may be decreased.

The level of the bias voltage CMLBIAS may be proportionally decreased to the decreasing of the third current I3.

In contrast, when the level of the power voltage VDD is decreased, the voltage level of the fourth node N4 may be proportionally decreased to the resistor ratio between the first transistor 611 and the second and third transistors 612 and 613 in the voltage change tracker 610.

The high-frequency component in the voltage level change of the fourth node N4 may be removed by the low pass filter 620. Only the low-frequency component may be applied to the bias level controller 630 through the fifth node N5.

When the current amount (I1 and I2) is constant, the fourth current I4 may be decreased by decreasing the voltage level of the fourth node N4 so that the third current I3 may be increased.

The level of the bias voltage CMLBIAS may be proportionally increased to the increasing of the third current I3.

Therefore, the bias voltage CMLBIAS may have the level that is compensated based on the temperature change and the level change of the power voltage VDD.

As mentioned above, the bias voltage CMLBIAS may have the level that is compensated based on the level change of the power voltage VDD as well as the temperature change. Particularly, the level of the bias voltage CMLBIAS may be compensated based on the change caused by removing the high-frequency component among the level change of the power voltage VDD.

Thus, the current mode circuit 200 may have a uniform transition timing of the output signals OUT and OUTB, regardless of the change of the power voltage VDD and the noises.

Figure 4:
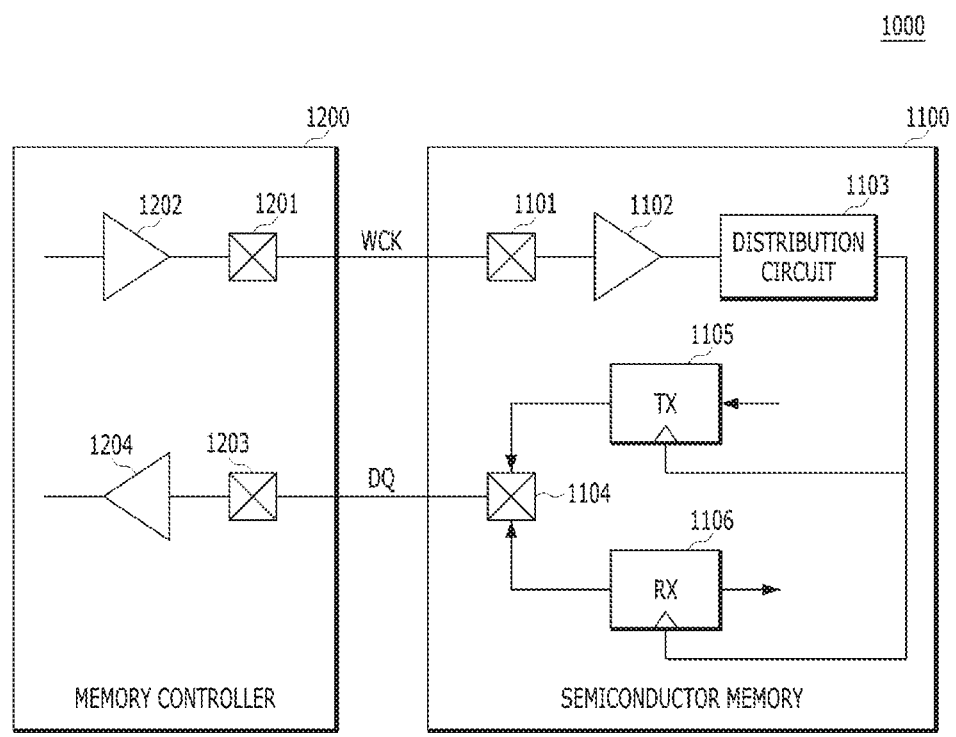
FIG. 4 is a view, illustrating a semiconductor system with a buffer circuit based on example embodiments.

FIG. 4 is a view, illustrating a semiconductor system with a buffer circuit based on example embodiments.

Referring to FIG. 4, a semiconductor system 1000 with the buffer circuit of example embodiments may include a semiconductor memory 1100 and a memory controller 1200.

The semiconductor memory 1100 may include a first pad 1101, a second pad 1104, a clock buffer 1102, a distribution circuit 1103, a transmitter TX 1105, and a receiver RX 1106.

An external clock signal WCK, provided from the memory controller 1200, may be inputted into the clock buffer 1102 through the first pad 1101.

The distribution circuit 1103 may be configured to distribute an output of the clock buffer 1102 to the transmitter 1105 and the receiver 1106.

The transmitter 1105 may be configured to transmit internal data to the memory controller 1200 through the second pad 1104 based on an output of the distribution circuit 1103.

The receiver 1106 may be configured to receive data DQ that is inputted through the second pad 1104 based on the output of the distribution circuit 1103.

The memory controller 1200 may include a first pad 1201, a second pad 1203, a clock buffer 1202, and a data buffer 1204.

The memory controller 1200 may output an internal clock signal as the external clock signal WCK through the clock buffer 1202 and the first pad 1201.

The data DQ that is received through the second pad 1203 may be provided to an internal circuit through the data buffer 1204.

The buffer circuit 100 of example embodiments may be used for the clock buffer 1102, the clock buffer 1202, and the data buffer 1204.

The clock buffer 1102, the clock buffer 1202, and the data buffer 1204 may have uniform transition timings of output signals that are generated by buffering the clock signal or the data based on the bias voltage regardless of the temperature change, the change of the power voltage and the noises.

Therefore, because the transition timings of the clock buffer 1102, the clock buffer 1202, and the data buffer 1204 may be uniformly maintained regardless of the change of the power voltage, operational timing margins of the semiconductor memory 1100 and the memory controller 1200 may be ensured to improve operational reliability of the semiconductor memory 1100 and the memory controller 1200.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A bias generation circuit comprising:
   a bias generator configured to generate a bias voltage based on a reference voltage; and
   a compensator configured to detect level changes of a power voltage and configured to control a level of the bias voltage based on detection results,
   wherein the compensator comprises:
   a voltage change tracker configured to detect the change of the power voltage;
   a low pass filter configured to remove a high-frequency component from an output of the voltage change tracker to allow a low-frequency component to pass through the low pass filter; and
   a bias level controller configured to control the level of the bias voltage based on an output of the low pass filter.

2. The bias generation circuit of claim 1, wherein the reference voltage has a temperature proportion characteristic.

3. The bias generation circuit of claim 1, wherein the compensator is configured to detect a low-frequency change that is generated by removing noises from the level of the power voltage and configured to control the level of the bias voltage based on the detection results.

4. The bias generation circuit of claim 1, wherein the bias generator comprises:
   a comparison circuit configured to compare a feedback voltage with the reference voltage and to output comparison results; and
   a voltage generation circuit configured to generate the feedback voltage and the bias voltage based on the output of the comparison circuit.

5. The bias generation circuit of claim 1, wherein the bias generator is activated by a first enable signal, and
   wherein the compensator is activated by a second enable signal.

* * * * *